United States Patent
Yang et al.

(10) Patent No.: US 8,981,527 B2
(45) Date of Patent: Mar. 17, 2015

(54) RESISTOR AND MANUFACTURING METHOD THEREOF

(75) Inventors: Jie-Ning Yang, Ping-Tung County (TW); Shih-Chieh Hsu, New Taipei (TW); Yao-Chang Wang, Tainan (TW); Chi-Horn Pai, Tainan (TW); Chi-Sheng Tseng, Tainan (TW); Kun-Szu Tseng, Tainan (TW); Ying-Hung Chou, Tainan (TW); Chiu-Hsien Yeh, Tainan (TW)

(73) Assignee: United Microelectronics Corp., Science-Based Industrial Park, Hsin-Chu (TW)

(*) Notice: Subject to any disclaimer, the term of this patent is extended or adjusted under 35 U.S.C. 154(b) by 161 days.

(21) Appl. No.: 13/215,237

(22) Filed: Aug. 23, 2011

(65) Prior Publication Data
US 2013/0049168 A1 Feb. 28, 2013

(51) Int. Cl.
*H01L 21/8234* (2006.01)
*H01L 49/02* (2006.01)
*H01L 27/06* (2006.01)

(52) U.S. Cl.
CPC ............ *H01L 28/20* (2013.01); *H01L 27/0629* (2013.01)
USPC ............ 257/538; 257/E21.621; 257/E27.024; 438/238

(58) Field of Classification Search
CPC ................ H01L 27/0629; H01L 28/20; H01L 29/66545; H01L 21/823842; H01L 23/5228; H01L 27/0738

USPC .......... 257/380, 529, 538, 379, 381, E29.325, 257/E27.016, E21.003, E21.602, E21.004, 257/E21.363, E27.03, E27.047, 536; 438/381, 238

See application file for complete search history.

(56) References Cited

U.S. PATENT DOCUMENTS

| 3,289,046 A | * | 11/1966 | Carr ............................... 361/772 |
| 3,416,959 A | * | 12/1968 | Cormia ......................... 427/103 |
| 4,104,607 A | * | 8/1978 | Jones ............................ 338/309 |
| 4,125,854 A | * | 11/1978 | McKenny et al. ............ 257/379 |
| 4,392,992 A | * | 7/1983 | Paulson et al. ................ 252/512 |
| 4,746,896 A | * | 5/1988 | Mcquaid et al. .............. 338/314 |
| 4,752,814 A | * | 6/1988 | Tuan ............................... 257/60 |
| 4,766,411 A | * | 8/1988 | Prieto et al. ................... 338/306 |
| 5,037,766 A | * | 8/1991 | Wang ............................ 438/161 |
| 5,135,888 A | * | 8/1992 | Chan et al. .................... 438/153 |
| 5,152,869 A | * | 10/1992 | Ferraris et al. ................. 216/16 |
| 5,468,672 A | * | 11/1995 | Rosvold ........................ 438/385 |
| 5,485,138 A | * | 1/1996 | Morris .......................... 338/306 |
| 5,494,845 A | * | 2/1996 | Sereda et al. ................. 438/384 |
| 5,503,878 A | * | 4/1996 | Suzuki et al. ................... 216/16 |
| 5,623,097 A | * | 4/1997 | Horiguchi et al. ......... 73/204.15 |
| 5,640,023 A | * | 6/1997 | Balasinski et al. ............. 257/66 |
| 5,656,524 A | * | 8/1997 | Eklund et al. ................. 438/238 |
| 5,821,960 A | * | 10/1998 | Mitani ............................ 347/58 |

(Continued)

*Primary Examiner* — Stephen W Smoot
*Assistant Examiner* — Edward Chin
(74) *Attorney, Agent, or Firm* — Winston Hsu; Scott Margo

(57) ABSTRACT

A method for forming a resistor integrated with a transistor having metal gate includes providing a substrate having a transistor region and a resistor region defined thereon, forming a transistor having a polysilicon dummy gate in the transistor region and a polysilicon main portion with two doped regions positioned at two opposite ends in the resistor region, performing an etching process to remove the polysilicon dummy gate to form a first trench and remove portions of the doped regions to form two second trenches, and forming a metal gate in the first trench to form a transistor having the metal gate and metal structures respectively in the second trenches to form a resistor.

8 Claims, 10 Drawing Sheets

(56) References Cited

U.S. PATENT DOCUMENTS

| | | | |
|---|---|---|---|
| 6,211,032 B1* | 4/2001 | Redford et al. | 438/384 |
| 6,274,452 B1* | 8/2001 | Miura et al. | 438/384 |
| 6,281,090 B1* | 8/2001 | Kukanskis et al. | 438/382 |
| 6,426,268 B1* | 7/2002 | Huppert et al. | 438/384 |
| 6,504,226 B1* | 1/2003 | Bryant | 257/510 |
| 6,809,379 B2* | 10/2004 | Kreupl | 257/347 |
| 6,890,810 B2* | 5/2005 | Amadon et al. | 438/210 |
| 6,891,747 B2* | 5/2005 | Bez et al. | 365/158 |
| 7,112,535 B2* | 9/2006 | Coolbaugh et al. | 438/721 |
| 7,213,327 B2* | 5/2007 | Su et al. | 29/610.1 |
| 7,259,040 B2* | 8/2007 | Pellizer et al. | 438/102 |
| 7,338,637 B2* | 3/2008 | Pease et al. | 422/68.1 |
| 7,410,246 B2* | 8/2008 | Bell et al. | 347/62 |
| 7,410,879 B1* | 8/2008 | Hill et al. | 438/384 |
| 7,427,926 B2* | 9/2008 | Sinclair et al. | 340/4.2 |
| 8,242,876 B2* | 8/2012 | Le Neel et al. | 338/25 |
| 8,481,397 B2* | 7/2013 | Booth et al. | 438/383 |
| 8,524,556 B1* | 9/2013 | Chiou et al. | 438/238 |
| 8,598,681 B2* | 12/2013 | Le Neel et al. | 257/536 |
| 2003/0150101 A1* | 8/2003 | Park et al. | 29/621 |
| 2005/0052498 A1* | 3/2005 | Delametter et al. | 347/56 |
| 2006/0224753 A1* | 10/2006 | Hama et al. | 709/230 |
| 2007/0096183 A1* | 5/2007 | Ogawa et al. | 257/300 |
| 2007/0189053 A1* | 8/2007 | Pellizzer et al. | 365/96 |
| 2009/0090977 A1* | 4/2009 | Freeman et al. | 257/379 |
| 2010/0127316 A1* | 5/2010 | Tu et al. | 257/296 |
| 2010/0328022 A1* | 12/2010 | Fan et al. | 338/309 |
| 2011/0057267 A1* | 3/2011 | Chuang et al. | 257/380 |
| 2011/0092035 A1* | 4/2011 | Hu et al. | 438/250 |
| 2011/0198705 A1* | 8/2011 | Chen et al. | 257/380 |
| 2011/0215321 A1* | 9/2011 | Booth et al. | 257/49 |
| 2012/0049291 A1* | 3/2012 | Scheiper et al. | 257/380 |
| 2012/0085748 A1* | 4/2012 | Le Neel et al. | 219/494 |
| 2012/0146187 A1* | 6/2012 | Anderson et al. | 257/538 |
| 2012/0168754 A1* | 7/2012 | Le Neel et al. | 257/57 |
| 2012/0170352 A1* | 7/2012 | Le Neel et al. | 365/148 |
| 2013/0032893 A1* | 2/2013 | Pal et al. | 257/379 |
| 2013/0049168 A1* | 2/2013 | Yang et al. | 257/538 |
| 2013/0168816 A1* | 7/2013 | Kang et al. | 257/536 |

* cited by examiner

RESISTOR AND MANUFACTURING METHOD THEREOF

BACKGROUND OF THE INVENTION

1. Field of the Invention

The invention relates to a resistor and a manufacturing method thereof, and more particularly, to a resistor and a manufacturing method for a resistor integrated with a transistor having metal gate.

2. Description of the Prior Art

To increase the performance of transistors, metal gates are popularly used in the semiconductor field: the metal gates competent to the high-K gate dielectric layer replace the traditional polysilicon gates to be the control electrode. The metal gate approach can be categorized to the gate first process and the gate last process. And the gate last process gradually replaces the gate first process because it provides more material choices for the high-k gate dielectric layer and the metal gate.

Additionally, resistors are elements which are often used for providing regulated voltage and for filtering noise in a circuit. The resistors generally include polysilicon and silicide layers.

In the current semiconductor field, though the fabricating processes are improved with the aim of reaching high yields, it is found that integration of the manufacturing methods of those different kinds of semiconductor devices is very complicated and difficult. Therefore, a method for fabricating a resistor integrated with a transistor having metal gate is still in need.

SUMMARY OF THE INVENTION

According to a first aspect of the present invention, a method for forming a resistor integrated with a transistor having metal gate is provided. The method includes providing a substrate having a transistor region and a resistor region defined thereon, forming a transistor having a polysilicon dummy gate in the transistor region and a polysilicon main portion with two doped regions positioned at two opposite ends in the resistor region, performing an etching process to remove the polysilicon dummy gate to form a first trench and remove portions of the doped regions to form two second trenches, and forming a metal gate in the first trench to form a transistor having the metal gate and metal structures respectively in the second trenches to form a resistor.

According to a second aspect of the present invention, a resistor is provided. The resistor includes a substrate, a polysilicon main portion formed on the substrate, two metal portions respectively positioned at two opposite ends of the polysilicon main portion on the substrate, and two doped regions respectively formed between the metal portions and the polysilicon main portion on the substrate.

According to the resistor and the method for forming a resistor integrated with a transistor having metal gate, the doped regions protects the polysilicon main portion of the resistor during the etching process, therefore the over etching problem is solved. Furthermore, a length of the doped region can be defined or decided depending on a required resistance. In other words, by adjusting a length of the doped region, a resistance of the resistor can be easily modified.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are schematic drawings illustrating a method for forming a resistor integrated with a transistor having metal gate provided by a first preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

FIGS. 7-8 are schematic drawings illustrating a method for forming a resistor integrated with a transistor having metal gate provided by a second preferred embodiment of the present invention, wherein FIG. 8 is a schematic drawing in a step subsequent to FIG. 7.

FIGS. 9-12 are schematic drawings illustrating a method for forming a resistor integrated with a transistor having metal gate provided by a third preferred embodiment of the present invention, wherein FIG. 10 is a schematic drawing in a step subsequent to FIG. 9, FIG. 11 is a schematic drawing in a step subsequent to FIG. 10, and FIG. 12 is a schematic drawing in a step subsequent to FIG. 11.

DETAILED DESCRIPTION

Figure 1:
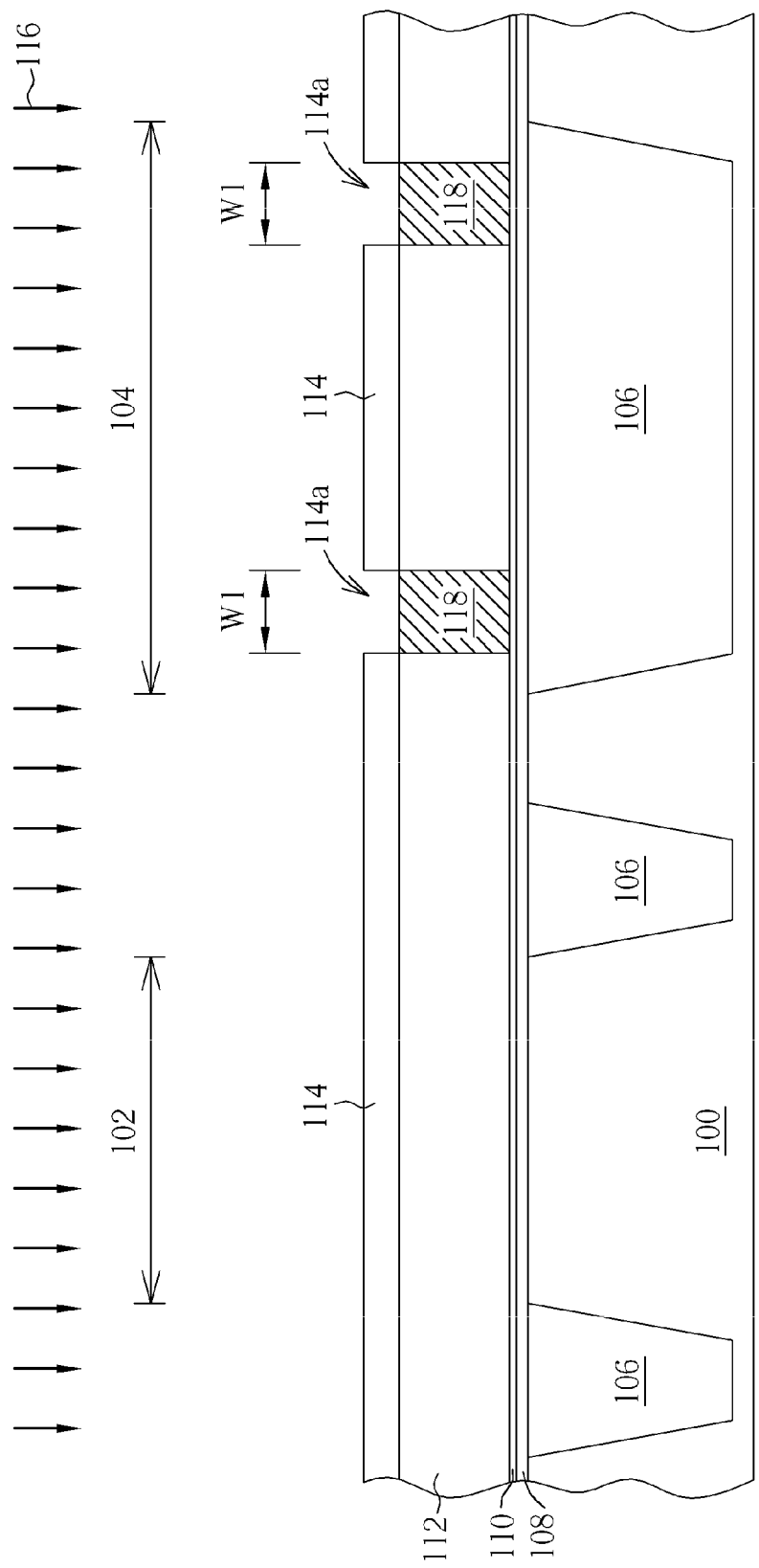

Please refer to FIGS. 1-6, which are schematic drawings illustrating a method for forming a resistor integrated with a transistor having metal gate provided by a first preferred embodiment of the present invention. As shown in FIG. 1, a substrate 100 having a transistor region 102 and a resistor region 104 defined thereon is provided. The substrate 100 also includes a plurality of shallow trench isolations (STIs) 106 positioned in between devices for providing electrical isolation. It is noteworthy that a STI 106 is formed in the resistor region 104. A dielectric layer 108, a bottom barrier layer 110, and a semiconductor layer such as a polysilicon layer 112 are sequentially formed on the substrate 100. As shown in FIG. 1, the dielectric layer 108 and the bottom barrier layer 110 are formed between the polysilicon layer 112 and the substrate 100. In the preferred embodiment, method for forming a resistor integrated with a transistor having metal gate is integrated with the high-k first process, therefore the dielectric layer 108 includes a high dielectric constant (high-k) materials such as rare earth metal oxide. The high-k gate dielectric layer 108 can include material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}$ TiO$_3$, BST). Additionally, an interfacial layer (not shown) can be formed in between the high-k gate dielectric layer 108 and the substrate 100. The bottom barrier layer 110 includes titanium nitride (TiN), but not limited to this. Then, a patterned mask 114 is formed on the polysilicon layer 112. The patterned mask 114 can include photoresist, but not limited to this. The patterned mask 114 has two openings 114a, and the openings 114a have a width W1. After forming the patterned mask 114, an ion implantation 116 is performed to form two doped regions 118 in the polysilicon layer 112 in the resistor region 104 through the openings 114a. Accordingly, the doped regions 118 include p-type dopants, but not limited to this. Furthermore, the doped regions 118 include the width W1 inherited from the openings 114a.

Figure 2:
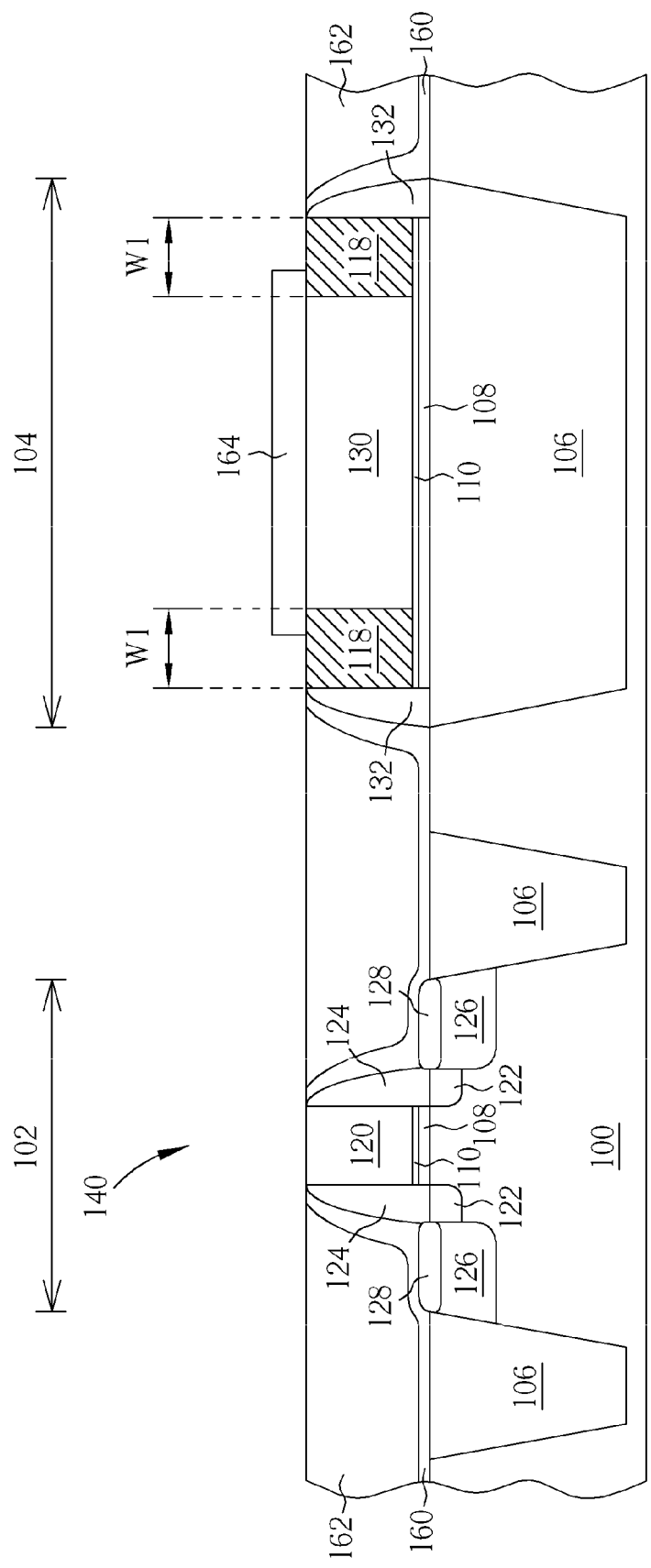

Please refer to FIG. 2. After forming the doped regions 118, the patterned mask 114 is removed and followed by patterning the polysilicon layer 112, the bottom barrier layer 110, and the dielectric layer 108. Consequently, a polysilicon dummy gate 120 for a transistor is formed in the transistor region 102 and a polysilicon main portion 130 for a resistor (shown in FIG. 5) is formed in the resistor region 104. As shown in FIG. 2, the polysilicon main portion 130 is formed to have the two doped regions 118 respectively positioned its two opposite ends. In other words, the two doped regions 118 are separated from each other by the polysilicon main portion 130. Then, lightly-doped drains (LDDs) 122 for the transistor are formed in the substrate 100 at two sides of the polysilicon dummy gate 120 in the transistor region 102, spacers 124 and 132 are respectively formed on sidewalls of the polysilicon dummy gate 120 and the doped regions 118, and a source/drain 126 is formed in the substrate 100 at two sides of the spacer 124 in the transistor region 102. Accordingly, a transistor 140 having the polysilicon dummy gate 120 is obtained in the transistor region 102. Additionally, salicides 128 are formed on the source/drain 126. After forming the transistor 140 having the polysilicon dummy gate 120, a contact etch stop layer (CESL) 160 and an inter-layer dielectric (ILD) layer 162 are sequentially formed. Since the steps and material choices for the abovementioned elements are well-known to those skilled in the art, those details are omitted herein in the interest of brevity. Furthermore, selective strain scheme (SSS) can be used in the preferred embodiment. For example, a selective epitaxial growth (SEG) method can be used to form the source/drain 126.

Please still refer to FIG. 2. After forming the CESL 160 and the ILD layer 162, a planarization process is performed to remove a portion of the CESL 160 and a portion of the ILD layer 162 to expose the polysilicon dummy gate 120 of the transistor 140, the doped regions 118, and the polysilicon main portion 130. Then, a patterned hard mask 164 is formed on the substrate 100. The patterned hard mask 164 can include silicon nitride (SiN), but not limited to this. As shown in FIG. 2, the patterned hard mask 164 exposes the polysilicon dummy gate 120 and a portion of the doped regions 118.

Figure 3:
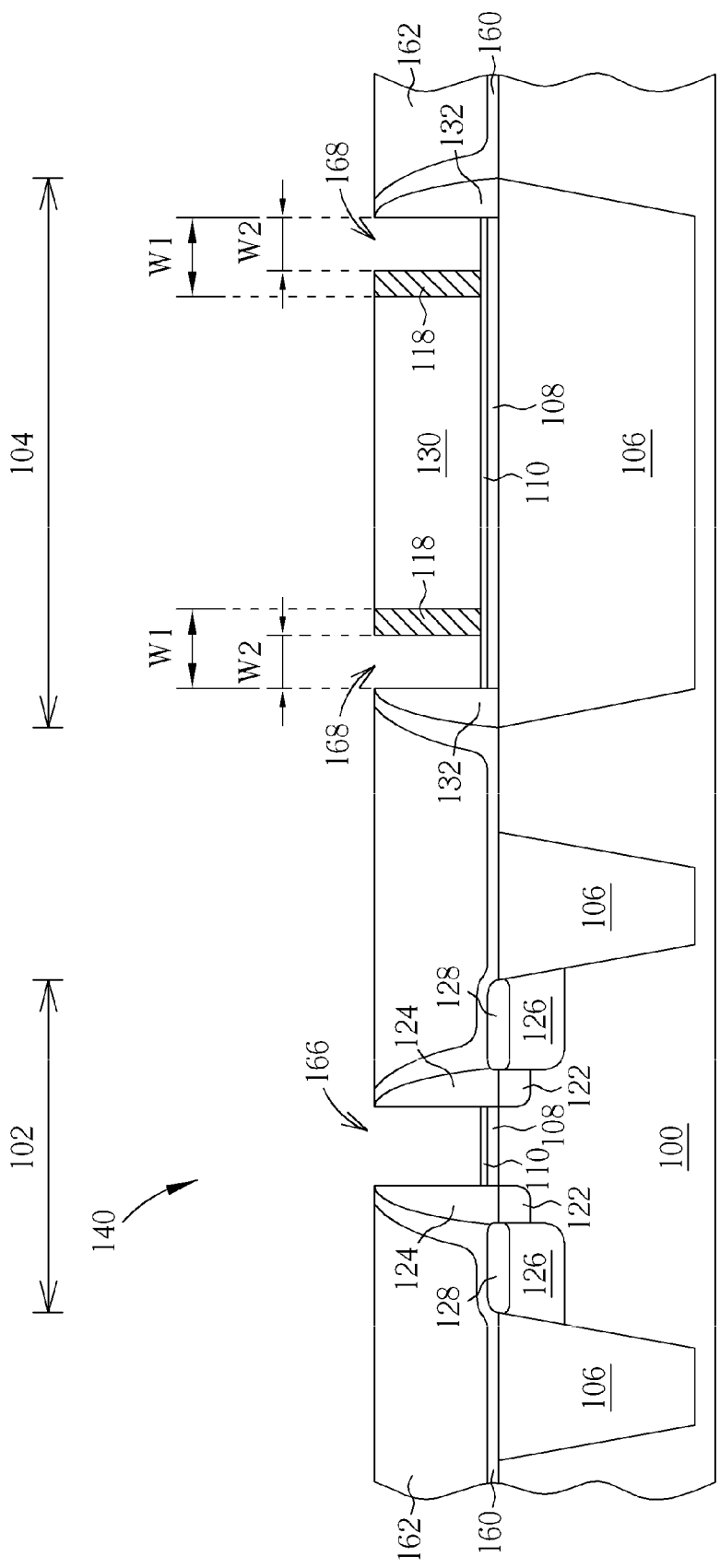

Please refer to FIG. 3. Next, a suitable etching process such as a dry etching process is performed. It is noteworthy that since an etching rate of the doped regions 118 and the polysilicon dummy gate 120 which include the polysilicon is different from that of the CESL 160, the ILD layer 162 and the patterned hard mask 164 which include dielectric material, only the polysilicon dummy gate 120 and the exposed doped regions 118 are removed. Consequently, a first trench 166 is formed in the transistor 140 and two second trenches 168 are formed in resistor region 104, simultaneously. It is noteworthy that the second trench 168 defined by the patterned hard mask 164, the ILD layer 162 and the CESL 160 includes a width W2, and the width W2 is always smaller than the width W1 of the original doped regions 118. Since the width W2 of the second trenches 168 is smaller than the width W1 of the doped regions 118, it is ensured that the polysilicon main portion 130 is protected from the etching process, and thus damages to the polysilicon main portion 130 due to over etching is avoided.

As shown in FIG. 3, the bottom barrier layer 110 is exposed in the first trench 166 and the second trenches 168 by the etching process. After forming the first gate trench 166 and the second gate trench 168, an etch stop layer (not shown) can be formed on the bottom barrier layer 110 in both of the first gate trench 166 and the second gate trench 168. The etch stop layer can include tantalum nitride (TaN), but not limited to this.

Figure 4:
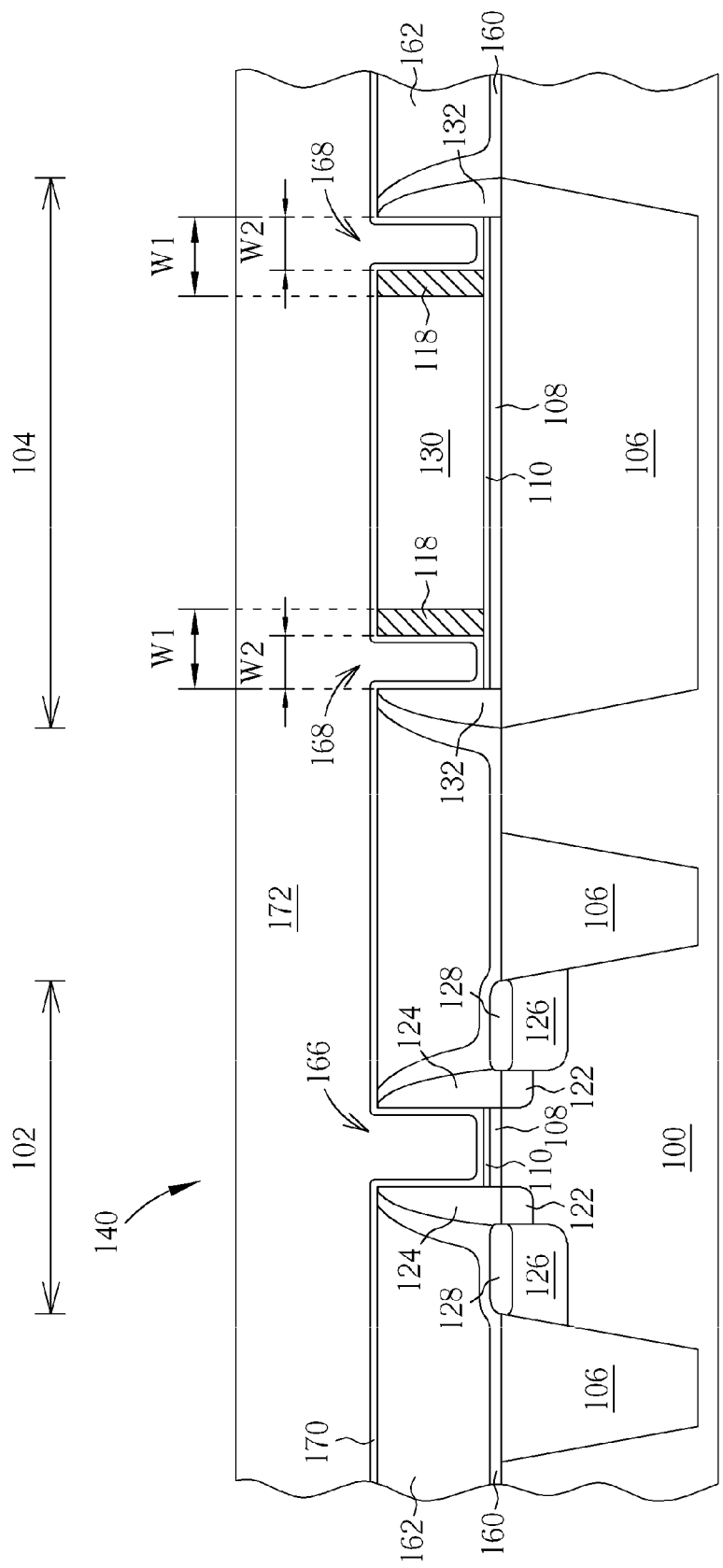

Please refer to FIG. 4. After forming the first trench 166 and the second trenches 168, a work function metal layer 170 required by the metal gate process is formed in both of the first trench 166 and the second trenches 168. According to the preferred embodiment, the work function metal layer 170 can include suitable materials providing an appropriate work function for p-type transistor or n-type transistor. Therefore, the work function metal layer 170 has a work function, and the work function can be between 4.8 eV and 5.2 eV, or alternatively between 3.9 eV and 4.3 eV. Thereafter, a filling metal layer 172 filling up the first trench 166 and the second trenches 168 is formed on the substrate 100. In the preferred embodiment, the filling metal layer 172 includes materials with low resistance and superior gap-filling characteristic, such as aluminum (Al), titanium aluminide (TiAl) or titanium aluminum oxide (TiAlO), but not limited to this. Additionally, a top barrier layer (not shown) can be formed between the work function metal layer 170 and the filling metal layer 172 if required.

Figure 5:
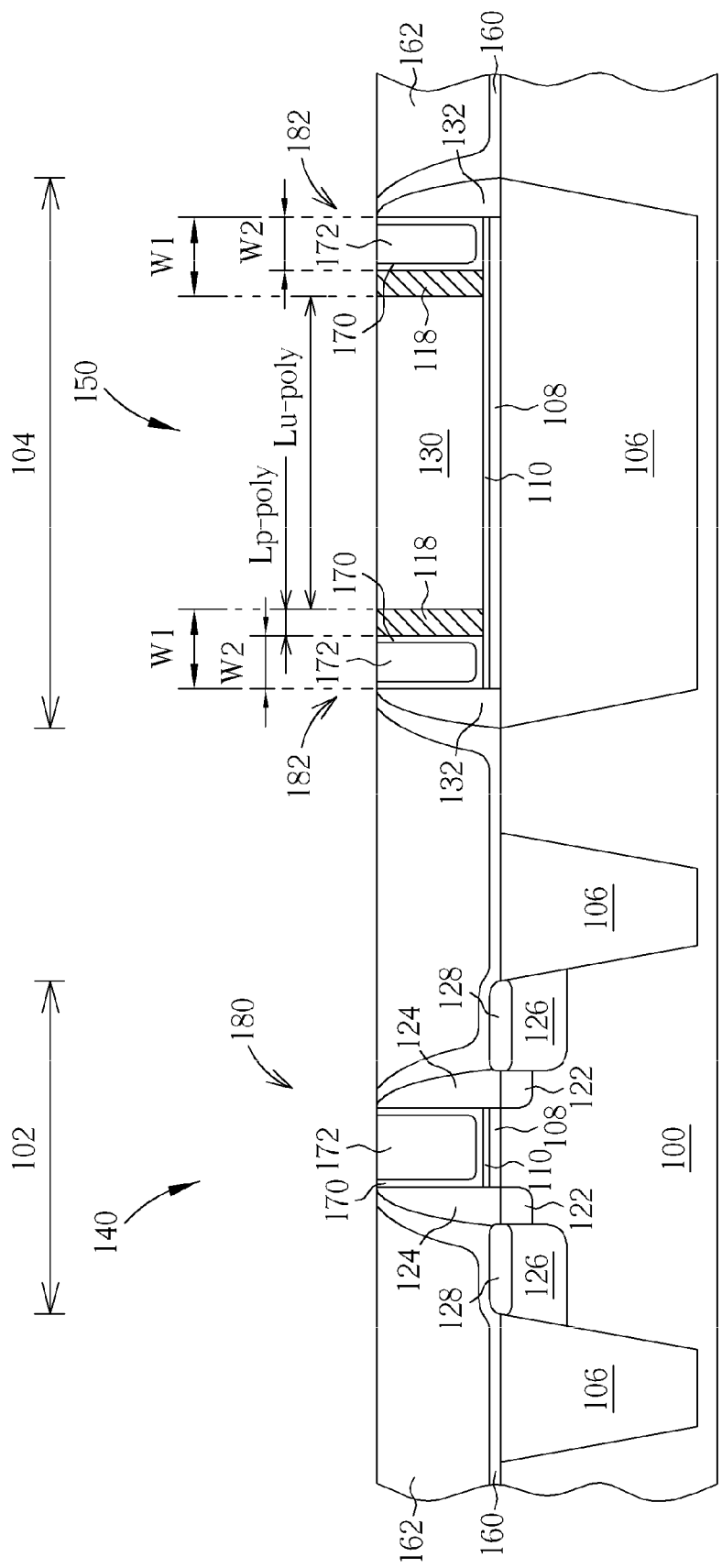

Please still refer to FIG. 5. After forming the work function metal layer 170 and the filling metal layer 172, a planarization process such as a CMP process is performed to remove the unnecessary filling metal layer 172 and work function metal layer 170. Consequently, a metal gate 180 for the transistor 140 is formed in the first trench 166 and two metal structures 182 are formed in the second trenches 168. As shown in FIG. 5, the metal gate 180 and the metal structure 182 are multi-layered structure. Furthermore, a resistor 150 having the polysilicon main portion 130, the doped regions 118 and two metal structures 182 serving as metal portions for the resistor 150 is formed in the resistor region 104. It is noteworthy that each doped region 118 is sandwiched by the polysilicon main portion 130 and the metal portion 182.

Figure 6:
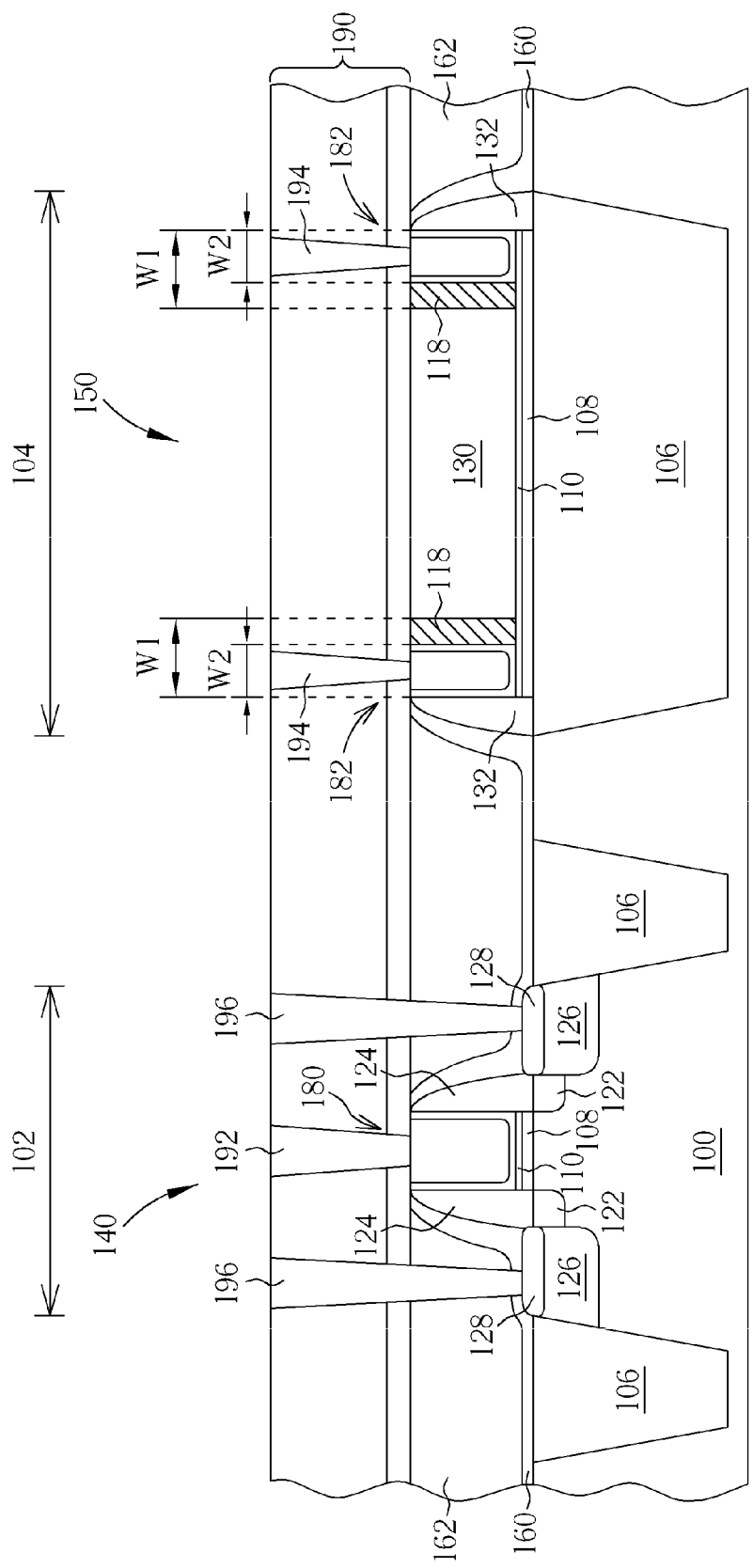

Please refer to FIG. 6. After forming the metal gate 180 and the resistor 150, a multilayered dielectric layer 190 is formed on the substrate 100, and a first contact 192 electrically connected to the metal gate 180 of the transistor 140, second contacts 194 electrically connected to the metal portions 182 of the resistor 150, and third contacts 196 electrically connected to the salicides 128 on the source/drain 126 of the transistor 140 are formed in the multilayered dielectric layer 190. It is noteworthy that because the contacts 192, 194, and 196 are landing on two different materials (the metal materials of the metal gate 180 and the metal portion 182, and the salicides 128), the contact process is simplified when comparing with the conventional contact process, of which the contacts are landing on three different materials (the metal material of the metal gate, the polysilicon of the resistor, and the salicide formed on the source/drain).

Please refer to FIG. 5 again. More important, the resistor 150 provided by the preferred embodiment has a resistance that can be adjusted. Please refer to the following Formula (1):

$$R(\Omega) = \left\{ 2 \cdot R(\text{end}) + Rs_{Total} \cdot \left[ \frac{L + \Delta L}{W + \Delta W} \right] \right\} * V_{coeff} * T_{coeff} \quad (1)$$

$$= \left\{ 2 \cdot R(\text{end}) + 2 \cdot Rs_{P\text{-}poly} \cdot \left[ \frac{L_{P\text{-}poly} + \Delta L}{W_{P\text{-}poly} + \Delta W} \right] + Rs_{U\text{-}poly} \cdot \right.$$

$$\left. \left[ \frac{L_{U\text{-}poly} + \Delta L}{W_{U\text{-}poly} + \Delta W} \right] \right\} * V_{coeff} * T_{coeff}$$

According to Formula (1), it is concluded that the resistance of the resistor 150 is in relationship with the length $L_{p\text{-}poly}$ of the remained doped region 118 and the length $L_{u\text{-}poly}$ of the polysilicon main portion 130. Therefore, by modifying the $L_{p\text{-}poly}$ of the remained doped region 118 and the length $L_{u\text{-}poly}$ of the polysilicon main portion 130, different resistance can be obtained. In other words, the preferred embodiment provides a resistor 150 have resistance that is adjustable as required by modifying the length $L_{p\text{-}poly}$ of the doped region 118.

According to the resistor 150 and the method for forming a resistor integrated with a transistor 140 having metal gate 180 provided by the preferred embodiment, the method is easily integrated with the gate-last process and the high-k first process. The doped regions 118 includes an etching rate different from the polysilicon main portion 130, therefore the doped regions 118 are resistible to the etchant and sufficient to protect the polysilicon main portion 130 of the resistor 150 from the etching process, particularly the lateral over etching. Briefly speaking, the over etching problem, which used to encroach on the polysilicon main portion 130 in the prior art, is solved. Secondly, the contact process is simplified since the contacts 192, 194 196 are landing on two different materials (the metal materials of the metal gate 180 and the metal portion 182, and the salicides 128). Furthermore, the length $L_{p\text{-}poly}$ of the doped regions 118 can be defined or decided depending on a required resistance. In other words, by adjusting the length $L_{p\text{-}poly}$ of the doped regions 118, the resistance of the resistor 150 can be easily modified.

Figure 7:
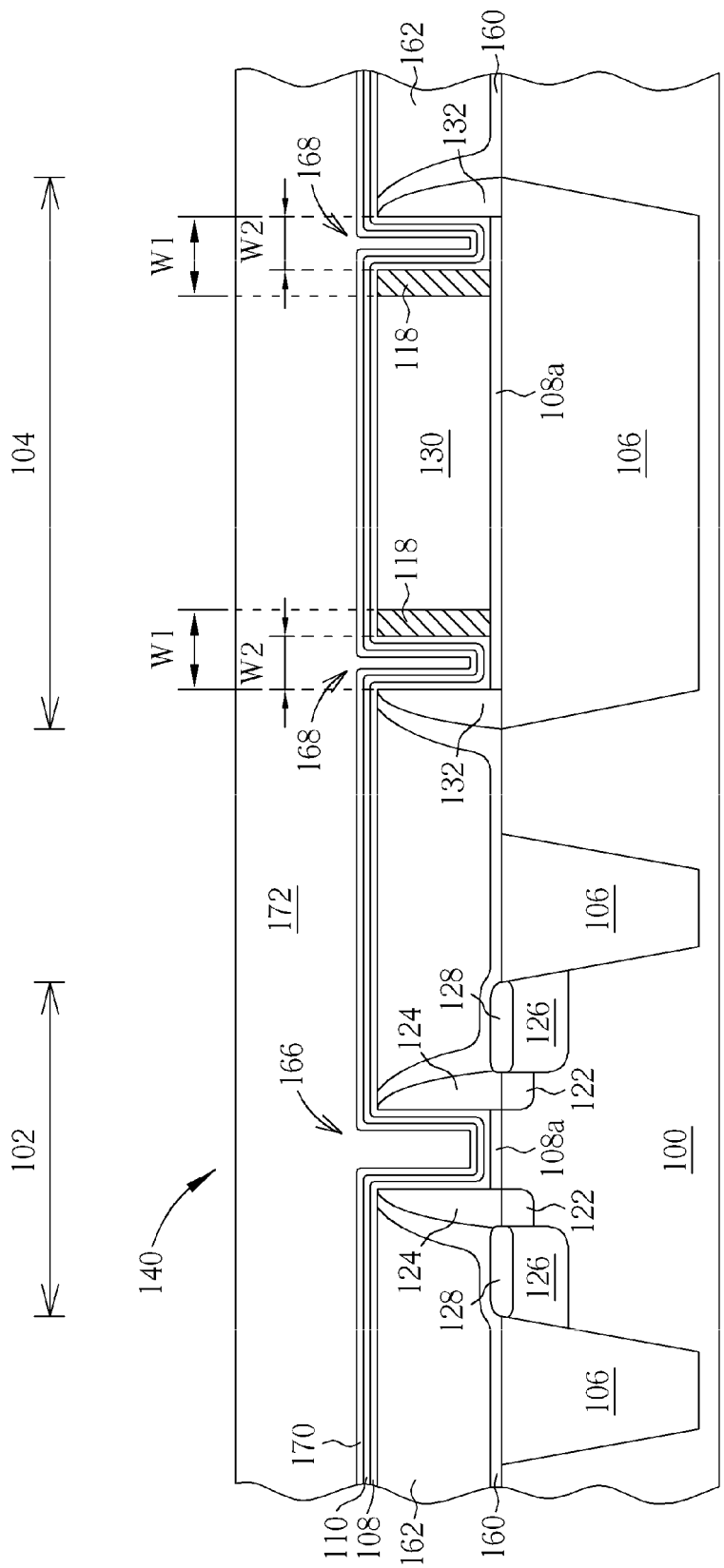
Figure 8:
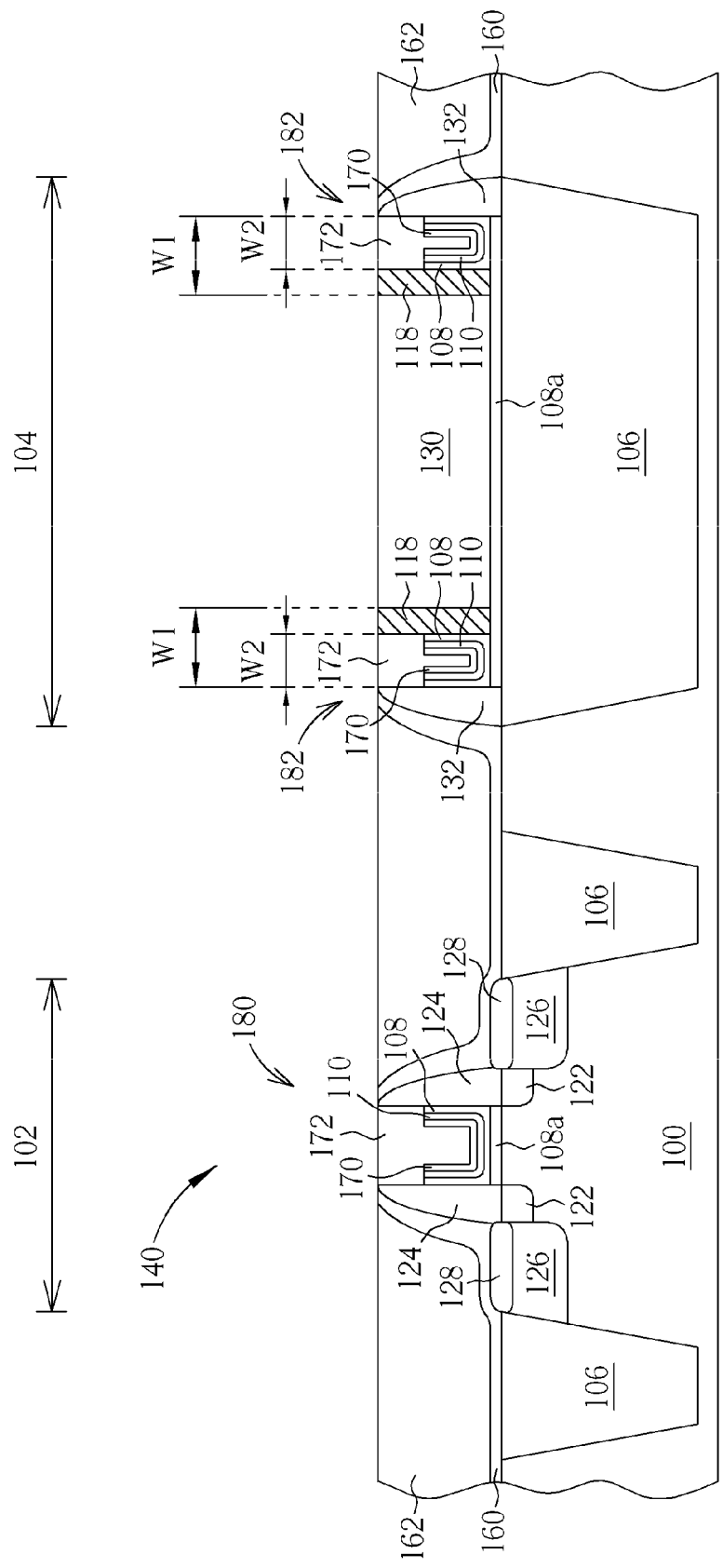

Please refer to FIG. 7-8, which are schematic drawings illustrating a method for forming a resistor integrated with a transistor having metal gate provided by a second preferred embodiment of the present invention. Please note that elements the same in both first and second preferred embodiment are designated by the same numerals, thus the material choices and steps for forming those elements are all omitted in the interest of brevity. According to the second preferred embodiment, the method provided by the present invention can be integrated with the high-k last process; therefore a dielectric layer 108a includes a conventional SiO$_2$ layer is formed between the substrate 100 and the polysilicon layer 112. After removing the polysilicon layer 112 to form the first gate trench 166 and the second gate trenches 168, the dielectric layer 108a exposed in the bottoms of the first gate trench 166 and the second gate trenches 168 serves as an interfacial layer. Next, a high-k gate dielectric layer 108 including abovementioned materials and a bottom barrier layer 110 as mentioned above are formed in the first gate trench 166 and the second gate trenches 168. Then, an etch stop layer (not shown) can be formed on the bottom barrier layer 110.

Please refer to FIG. 7 again. After forming the etch stop layer, a work function metal layer 170 is formed in the first gate trench 166 and the second gate trenches 168. The work function metal layer 170 can include suitable materials providing an appropriate work function for p-type transistor or n-type transistor. Therefore, the work function metal layer 170 has a work function, and the work function can be between 4.8 eV and 5.2 eV, or alternatively between 3.9 eV and 4.3 eV.

Please refer to FIG. 7. Thereafter, a filling metal layer 172 filling up the first trench 166 and the second trenches 168 is formed on the substrate 100. In the preferred embodiment, the filling metal layer 172 includes materials with low resistance and superior gap-filling characteristic. Additionally, a top barrier layer (not shown) can be formed between the work function metal layer 170 and the filling metal layer 172 if required. It is noteworthy that for improving the gap-filling result of the following formed metal materials, another patterned mask (not shown) can be formed in the first trench 166 and the second trenches 168 and a surface of the patterned mask is lower than the opening of the first trench 166 and the second trenches 168. Accordingly, the work function metal layer 170, the bottom barrier layer 110, and the high-k dielectric layer 108 not covered by the patterned mask are removed and the remained work function metal layer 170, the remained bottom barrier layer 110, and the remained high-k dielectric layer 108 are left only in the first gate trench 166 and the second trenches 168, particularly on the bottom and sidewalls of the first gate trench 166 and the second trenches 168. That means a topmost portion of the high-k dielectric layer 108, the bottom barrier layer 110, and the work function metal layer 170 are lower than the opening of first trench 166 and the second trenches 168, and consequently the gap-filling result of the following formed metal materials can be improved.

Please refer to FIG. 8. After forming the filling metal layer 172, a CMP process is performed to remove the unnecessary filling metal layer 172 and work function metal layer 170. Consequently, a metal gate 180 for the transistor 140 is formed in the first trench 166 and two metal structures 182 are formed in the second trench 168. As shown in FIG. 8, the metal gate 180 and the metal structures 182 are multilayered structure. Furthermore, a resistor 150 having the polysilicon main portion 130, the doped regions 118 and two metal structures 182 serving as a metal portion for the resistor 150 is formed in the resistor region 104. It is noteworthy that each doped region 118 is sandwiched by the polysilicon main portion 130 and the metal portion 182. Furthermore, a multilayered dielectric layer 190 and contacts 192, 194, and 196 are sequentially formed as mentioned above and those details are omitted for simplicity.

According to the second preferred embodiment, the resistor 150 and the method for forming a resistor integrated with a transistor 140 having metal gate 180 not only benefits by the advantages described in the first preferred embodiment but also is easily integrated with the high-k last process.

Please refer to FIGS. 9-12, which are schematic drawings illustrating a method for forming a resistor integrated with a transistor having metal gate provided by a third preferred embodiment of the present invention. Please note that the third preferred embodiment is exemplarily described with the method integrated with the high-k first process, but those skilled in the art would easily realize that the method provided by the third preferred embodiment can be integrated with the high-k last process as mentioned in the second preferred embodiment. Furthermore, though only the resistor are illustrated in FIGS. 9-12, the steps for forming the transistor having metal gate can be easily realized by the description mentioned in the first and second preferred embodiment. And therefore elements the same in the first, second, and third preferred embodiments are designated by the same numerals.

Figure 9:
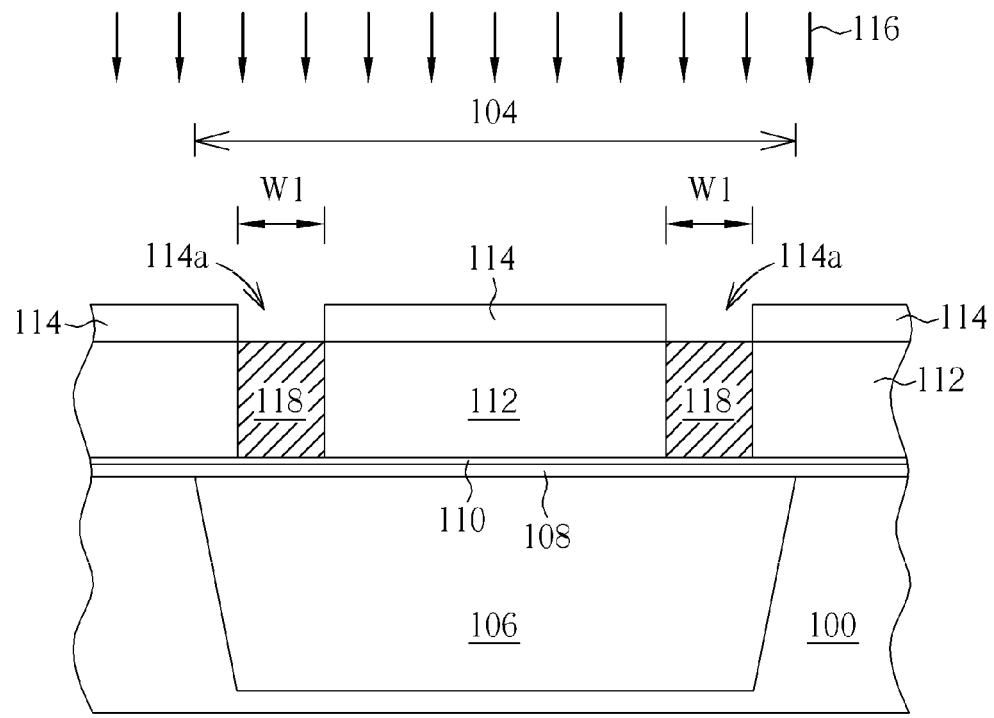

Please refer to FIG. 9. A substrate 100 having a transistor region (as shown in FIGS. 1-8) and a resistor region 104 defined thereon is provided. The substrate 100 also includes a plurality of STIs 106 for providing electrical isolation between devices. It is noteworthy that a STI 106 is formed in the resistor region 104. A dielectric layer 108, a bottom barrier layer 110, and a semiconductor layer such as a polysilicon layer 112 are sequentially formed on the substrate 100. Because the preferred embodiment is exemplarily integrated with the high-k first process, the dielectric layer 108 includes a high-k material as mentioned above and the bottom barrier layer 110 includes TiN, but not limited to this. Then, a patterned mask 114 is formed on the polysilicon layer 112. The patterned mask 114 has two openings 114a and the openings 114a have a width W1. After forming the patterned mask 114, an ion implantation 116 is performed to form two doped regions 118 in the polysilicon layer 112 in the resistor region 104. Accordingly, the doped regions 118 include p-type dopants, but not limited to this. Furthermore, the doped regions 118 include the width W1 inherited from the openings 114a.

Figure 10:
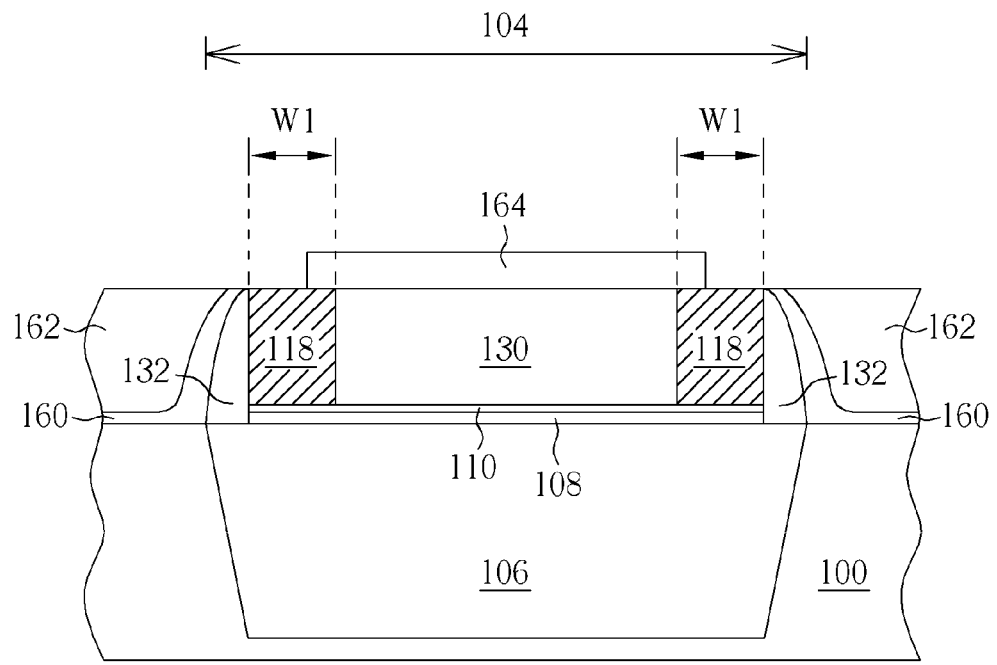

Please refer to FIG. 10. After forming the doped region 118, the patterned mask 114 is removed and followed by patterning the polysilicon layer 112, the bottom barrier layer 110, and the dielectric layer 108. Consequently, a polysilicon dummy gate (not shown) for a transistor is formed in the transistor region 102 and a polysilicon main portion 130 for a resistor (shown in FIG. 12) is formed in the resistor region 104. As shown in FIG. 10, the polysilicon main portion 130 is formed to have the two doped regions 118 respectively positioned its two opposite ends. In other words, the two doped regions 118 are separated from each other by the polysilicon main portion 130. Then, elements of the transistor are sequentially formed as mentioned above. And a spacer 132 is formed on sidewalls of the doped regions 118. Next, a CESL 160 and an ILD layer 162 are sequentially formed. Since the steps and material choices for the abovementioned elements are well-known to those skilled in the art, those details are omitted herein in the interest of brevity.

Please still refer to FIG. 10. After forming the CESL 160 and the ILD layer 162, a planarization process is performed to remove a portion of the CESL 160 and a portion of the ILD layer 162 to expose the polysilicon dummy gate of the transistor and the polysilicon main portion 130: Then, a patterned hard mask 164 is formed on the substrate 100. As shown in FIG. 10, the patterned hard mask 164 exposes a portion of the doped regions 118 on the substrate 100.

Figure 11:
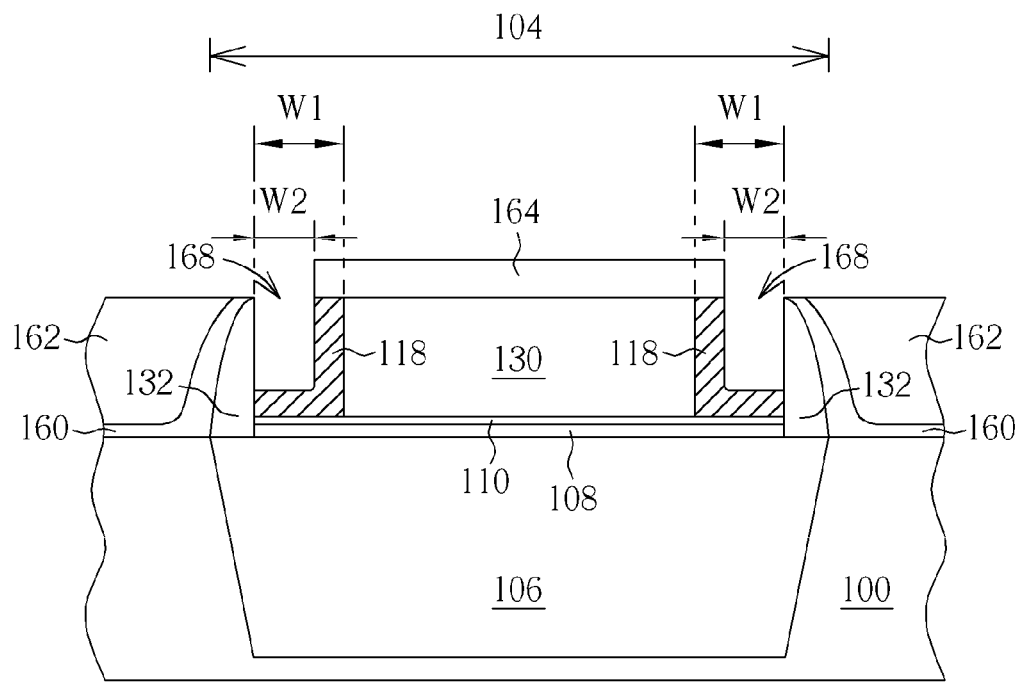

Please refer to FIG. 11. Next, a suitable etching process such as a dry etching process is performed. It is noteworthy that since an etching rate of the doped regions 118 which includes the polysilicon is different from that of the CESL 160, the ILD layer 162 and the patterned hard mask 164 which include dielectric material, only the exposed doped regions 118 are removed. Consequently, two second trenches 168 are formed in resistor region 104. It is noteworthy that the second trench 168 defined by the patterned hard mask 164, the ILD layer 162 and the CESL 160 includes a width W2, and the width W2 is always smaller than the width W1 of the original doped regions 118. Since the width W2 of the second trenches 168 is smaller than the width W1 of the doped region, it is ensured that the polysilicon main portion 130 is protected from the etching process, and thus damages to the polysilicon main portion 130 due to over etching is avoided.

It is further noteworthy that in the preferred embodiment, the doped regions 118 exposed to the dry etching are not entirely removed. As shown in FIG. 11, the doped regions 118 are remained on the sidewalls and bottoms of the second trenches 168. Consequently, the doped regions 118 include an L shape after the dry etching process.

Figure 12:
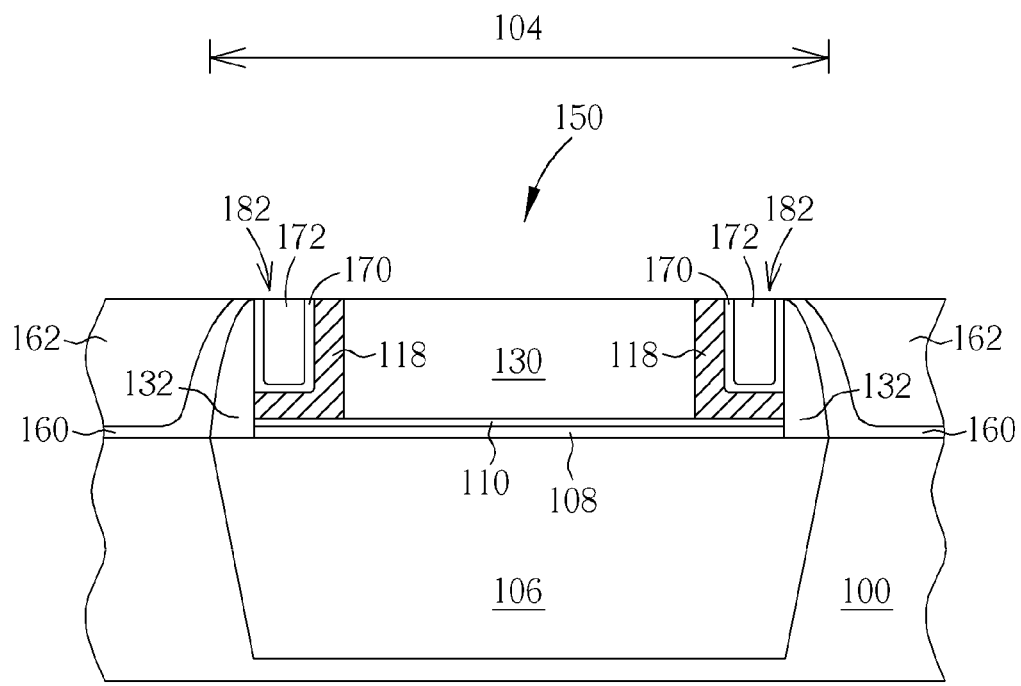

Please refer to FIG. 12. After forming the second trenches 168, the patterned hard mask 164 is removed, and an etch stop layer (not shown) as mentioned above can be formed on the substrate 100. Next, a work function metal layer 170 is formed in the first gate trench 166 and the second gate trenches 168. The work function metal layer 170 can include suitable materials providing an appropriate work function for p-type transistor or n-type transistor. Therefore, the work function metal layer 170 has a work function, and the work function can be between 4.8 eV and 5.2 eV, or alternatively between 3.9 eV and 4.3 eV.

Please refer to FIG. 12 again. Thereafter, a filling metal layer 172 filling up the second trenches 168 is formed on the substrate 100. In the preferred embodiment, the filling metal layer 172 includes materials with low resistance and superior gap-filling characteristic. Additionally, a top barrier layer (not shown) can be formed between the work function metal layer 170 and the filling metal layer 172 if required. After forming the filling metal layer 172, a CMP process is performed to remove the unnecessary filling metal layer 172 and work function metal layer 170. Consequently, a metal gate for the transistor is formed and two metal structures 182 are formed in the second trench 168. As shown in FIG. 12, the metal structures 182 are multilayered structure. Furthermore, a resistor 150 having the polysilicon main portion 130, the doped regions 118 and two metal structures 182 serving as metal portions for the resistor 150 is formed in the resistor region 104. It is noteworthy that each doped region 118 is sandwiched by the polysilicon main portion 130 and the metal portion 182. Furthermore, a multilayered dielectric layer 190 and contacts 192, 194, and 196 are sequentially formed as mentioned above and those details are omitted for simplicity.

According to the third preferred embodiment, the resistor 150 provided by the preferred embodiment includes the L-shaped doped region 118 horizontally in between the polysilicon main portion 130 and the metal portion 182, and vertically in between the metal portion 182 and the bottom barrier layer 110. It is concluded that the doped regions 118 render superior protection to the polysilicon main portion 130 and the bottom barrier layer 110.

Accordingly, the present invention provides a method for forming a resistor integrated with a transistor having metal gate that is easily integrate with the gate last process, the high-k first process, and the high-k last process. In other words, the method provided by the present invention can easily integrate the resistor and the transistor having metal gate without increasing process complexity. Furthermore, according to the resistor and the method for forming a resistor integrated with a transistor having metal gate, the doped regions protect the polysilicon main portion of the resistor during the etching process, therefore the over etching problem is solved. Furthermore, a length of the doped region can be defined or decided depending on a required resistance. In other words, by adjusting the width of the doped region, a resistance of the resistor can be easily modified.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistor comprising:
a substrate;
a polysilicon main portion formed on the substrate;

two metal portions respectively positioned at two opposite ends of the polysilicon main portion on the substrate, wherein the metal portions respectively contact a spacer; and two doped polysilicon regions respectively formed between the metal portions and the polysilicon main portion on the substrate, wherein the doped polysilicon regions contact both of the metal portions and the polysilicon main portion, and the doped polysilicon regions are spaced apart from the spacer by the metal portions.

2. The resistor according to claim 1, further comprising a high-k dielectric layer and a bottom barrier layer sequentially formed on the substrate.

3. The resistor according to claim 2, wherein the high-k dielectric layer and the bottom barrier layer are formed between the substrate and the polysilicon main portion, between the substrate and the metal portion, and between the substrate and the doped polysilicon region.

4. The resistor according to claim 2, wherein the high-k dielectric layer and the bottom barrier layer are sandwiched between the metal portion and the doped polysilicon region.

5. The resistor according to claim 4, wherein the doped polysilicon region is an L-shaped region.

6. The resistor according to claim 2, wherein topmost portions of the high-k dielectric layer and the bottom barrier layer are lower than a surface of the metal portion.

7. The resistor according to claim 1, wherein a width of the doped polysilicon region is defined depending on a required resistance.

8. The resistor according to claim 1 further comprising contacts electrically connecting to the metal portions, respectively.

* * * * *